United States Patent
Graetz et al.

(10) Patent No.: US 8,174,418 B2
(45) Date of Patent: May 8, 2012

(54) INEXPENSIVELY IMPROVING RESOLUTION AND REDUCING NOISE OF LOW-NOISE SIGNALS

(75) Inventors: Ernest Frank John Graetz, Largo, FL (US); Kirby Kueber, Clearwater, FL (US); William Joseph Trinkle, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 384 days.

(21) Appl. No.: 12/502,807

(22) Filed: Jul. 14, 2009

(65) Prior Publication Data

US 2011/0227771 A1    Sep. 22, 2011

(51) Int. Cl.
*H03M 1/20* (2006.01)
(52) U.S. Cl. .......................................... 341/131; 341/155
(58) Field of Classification Search ........... 341/125–155
See application file for complete search history.

(56) References Cited

U.S. PATENT DOCUMENTS

| | | | |
|---|---|---|---|
| 4,857,927 A * | 8/1989 | Takabayashi | 341/131 |
| 5,068,661 A | 11/1991 | Kaneaki et al. | |
| 5,148,163 A * | 9/1992 | Frindle | 341/131 |
| 5,189,418 A * | 2/1993 | Bartz et al. | 341/131 |
| 5,451,947 A * | 9/1995 | Morrison | 341/131 |
| 5,493,298 A * | 2/1996 | Bartz | 341/131 |
| 5,940,138 A * | 8/1999 | Lowe | 348/574 |
| 6,064,328 A | 5/2000 | Scheidig et al. | |
| 6,433,723 B1 | 8/2002 | Randall | |
| 6,768,437 B1 * | 7/2004 | Ruotsalainen et al. | 341/143 |
| 7,015,851 B1 * | 3/2006 | Bruhns et al. | 341/155 |
| 7,015,853 B1 * | 3/2006 | Wolff et al. | 341/155 |
| 7,075,466 B1 * | 7/2006 | Woodall et al. | 341/131 |
| 7,277,033 B1 * | 10/2007 | Kriz | 341/131 |
| 7,348,906 B2 * | 3/2008 | O'Donnell et al. | 341/131 |

(Continued)

FOREIGN PATENT DOCUMENTS

EP    0225641    6/1987

OTHER PUBLICATIONS

Kester, "ADC Input Noise: The Good, the Bad, and the Ugly. Is No Noise Good Noise?", "http://www.analog.com/library/analogDialogue/archives/40-02/adc_noise.html", Feb. 2006, pp. 1-5, Publisher: Analog Dialogue.

(Continued)

Primary Examiner — Lam T Mai
(74) Attorney, Agent, or Firm — Fogg & Powers LLC

(57) ABSTRACT

Systems and methods for improving resolution of low-noise signals in an analog-to-digital conversion circuit. A simple, low cost pseudo-noise generating circuit is disclosed that, when connected to the signal conditioning circuitry of A/D conversion circuit, adds pseudo-noise to an analog input voltage signal. Additional pseudo-noise is beneficial for improving the resolution of analog-to-digital conversion when oversampling and summing or averaging are used in post-conversion processing operations. The circuit is composed of a plurality of resistors configured in at least two parallel branches. An individually switchable voltage source output is connected to each branch. A resulting analog voltage can be measured at a common termination point for the branches, depending on the combination of switchable voltage source output turned on, and the branch to which the voltage output is applied. By varying the combination of switchable voltage source outputs turned on over time, a known analog pseudo-noise signal is developed.

17 Claims, 6 Drawing Sheets

U.S. PATENT DOCUMENTS

| | | | |
|---|---|---|---|
| 8,004,436 B2* | 8/2011 | Kapusta et al. | 341/131 |
| 2004/0006580 A1 | 1/2004 | Miller, Jr. | |
| 2005/0068212 A1 | 3/2005 | Jensen | |

OTHER PUBLICATIONS

Kester, "Using Input-Referred Noise to Improve Analog-To-Digital Converter Resolution", "http://www.commsdesign.com/article/printableArticle.jhtml?articleID=193501585", Nov. 2, 2006, Publisher: CommsDesign.

Badzmirowski et al., "Effectiveness of Various Dithering Architecture for Linearisation of High-Resolution Oversampling A/D Converters", "Advanced A/D and D/A Conversion Techniques and their Applications", Jul. 27-28, 1999, pp. 175-178, No. 466, Publisher: IEEE.

European Patent Office, "European Search Report", Nov. 12, 2010, Published in: EP.

Holman et al, "An Integrated Analog/Digital Random Noise Source", "IEEE Transactions on Circuits and Systems—I: Fundamental Theory and Applications", Jun. 1997, pp. 521-528, vol. 44, No. 6, Publisher: IEEE.

Kamensky et al., "Evaluation of Measurement Performance in Averaging Quantization System with Noise", "http://www.radioeng.cz/fulltexxts/2007/07_04_114_119.pdf", Dec. 2007, pp. 114-119, vol. 16, No. 4, Publisher: Radioengineering.

* cited by examiner

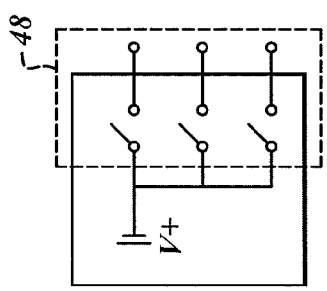
FIG.4-1 [000]
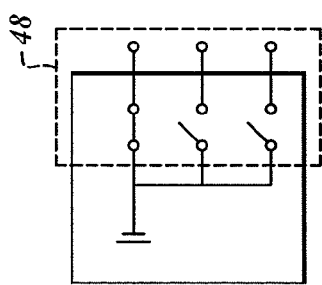
FIG.4-2 [001]
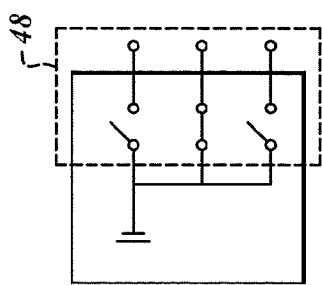
FIG.4-3 [010]
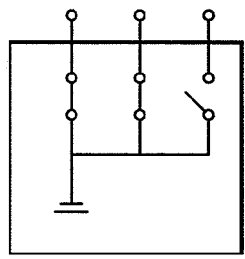
FIG.4-4 [011]
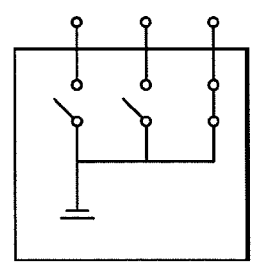
FIG.4-5 [100]
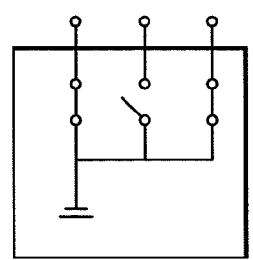
FIG.4-6 [101]
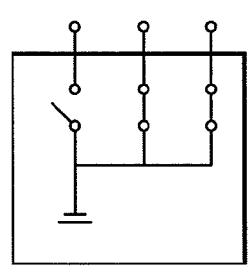
FIG.4-7 [110]
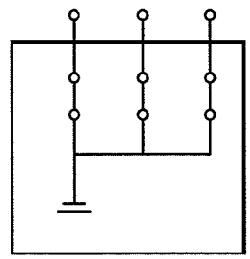
FIG.4-8 [111]

INEXPENSIVELY IMPROVING RESOLUTION AND REDUCING NOISE OF LOW-NOISE SIGNALS

GOVERNMENT INTEREST

The invention described herein was made in the performance of work under U.S. Government Contract No. N00030-08-C-0010 for the U.S. Navy. The Government may have rights to portions of this invention.

BACKGROUND OF THE INVENTION

The noise free code resolution of an A/D converter is the number of bits of resolution beyond which it is no longer possible to distinctly resolve individual codes. In other words, this is essentially the number of digital code levels actually available after correction for the loss in resolution due to input referred noise. Said another way, this is the degree to which digital codes become lumped together as indistinguishable from one another due to the noise added during conversion, and is called quantization noise.

To counter this loss in resolution, averaging of the digital output signal can be used. Averaging is effective because by collecting a sufficient number of digital output samples, the distribution of sampled outputs that determines noise resolution becomes increasingly tightly defined. The effect is visible as an increase in height and a narrowing in the neck of the distribution of sampled outputs compared with a distribution of fewer samples. This decreases the distribution's standard deviation, and therefore the noise free code resolution.

In order to develop a distribution, though, there must be a minimum level of variability in the acquired signal. This leads to a paradoxical requirement: to raise the resolution of an A/D converter, one can use digital averaging, but with this technique there is an accompanying need to actually have a minimum level of noise in the signal. If a suitable noise signal is not available, then one must be intentionally generated or something that gives the same result.

A general noise signal is one possibility, but is often not selected, most often because it has been filtered out at earlier circuit stages of the circuit than the A/D converter, or is an insufficient noise level. White noise is another choice, however it is cumbersome to introduce without adding significant circuitry and has disadvantages.

SUMMARY OF THE INVENTION

The present invention provides circuits and methods for improving the resolution of an analog to digital converter. With this method, an analog repeatable deterministic signal is deliberately summed with an analog input voltage signal before passing the summed signal to an analog digital converter. The analog repeatable deterministic signal is generated by a circuit including a plurality of resistors making up at least two circuit branches and a common connection point. The common connection point is connected to a ground connection through a current summing resistor. The common connection point is connected to a signal conditioning circuit at an amplifier input. Finally the two or more circuit branches are connected to a plurality of switchable voltage source outputs.

In one aspect of the invention, the plurality of switchable voltage source outputs are switched on and off in various combinations. At the common connection point, also referred to as the repeating deterministic signal output node, the voltage varies as a function of the combination of switchable voltage source outputs are switched on, and the circuit branches to which this voltage is applied. This deterministic varying voltage is added to the analog input voltage signal by connection of the deterministic signal output node to a signal conditioning amplifier input that is also receiving the analog input signal.

In another aspect of the invention, three switchable voltage source outputs are included. There are eight possible switching combinations for these three voltage source outputs. Each of the eight possible combinations is executed before repeating any combination a second time. In a further refinement, by repeating this sequence of combinations periodically, a known and periodic pseudo-noise signal is available to the signal conditioning circuit at the analog to digital converter.

Connection of the previously described repeating deterministic signal generating circuit to the amplifier input of the signal conditioning circuit makes an analog deterministic signal available to the signal conditioning circuit of A/D converter circuit. With the addition of the generated deterministic signal to the analog input voltage signal and oversampling and averaging of the resultant digital output signal, the resolution of the analog to digital converter can be increased. By adding a repeating deterministic signal with a repetition rate at an appropriate period shorter than the data averaging period it can be totally filtered out and any DC offset introduced is known and can be subtracted out.

BRIEF DESCRIPTION OF THE DRAWINGS

Preferred and alternative embodiments of the present invention are described in detail below with reference to the following drawings:

FIG. 4-1 thru 4-8 is a display of the possible switch configurations of the circuit shown in FIG. 3;

FIG. 5 shows an analog voltage output signal from the repeating deterministic signal generating circuit in FIG. 3 for a sequence of switchable voltage source output combinations of FIG. 4; and FIG. 6 is a circuit diagram of a temperature monitoring circuit, including a repeating deterministic signal generating circuit and an analog signal conditioning circuit for adding the repeating deterministic signal to the analog voltage input signal.

DETAILED DESCRIPTION OF THE INVENTION

Figure 1:
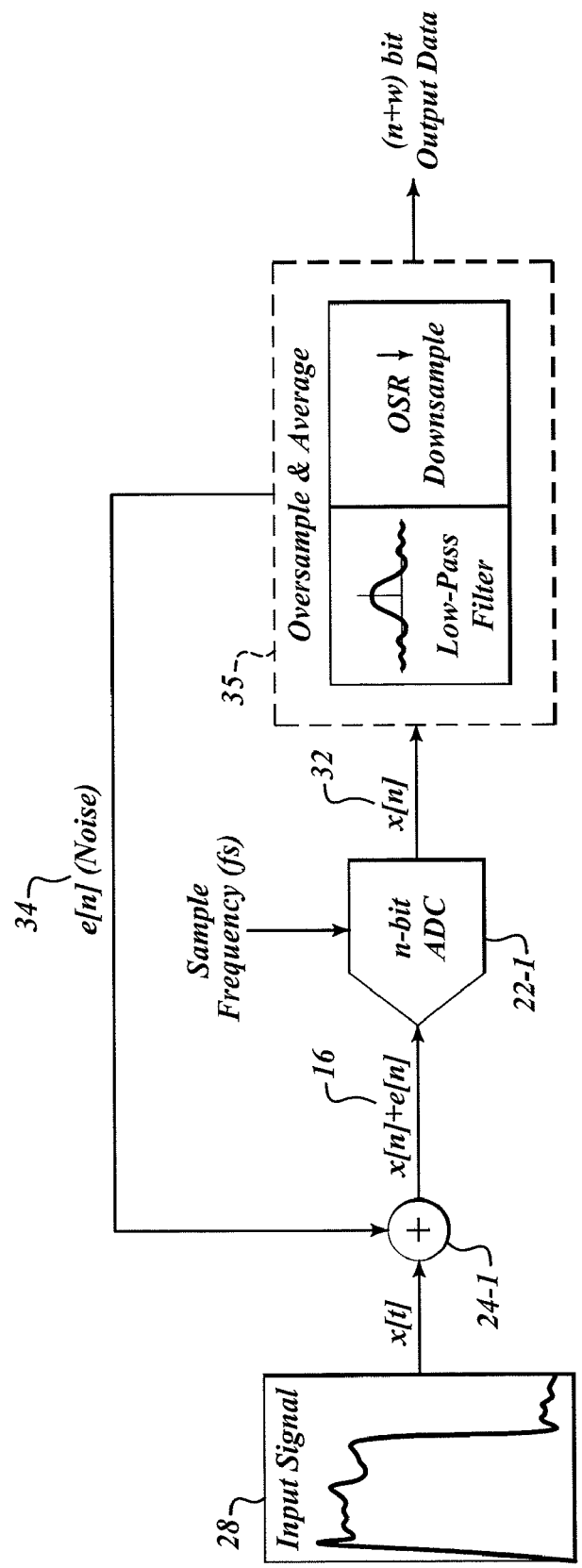
FIG. 1 is an electrical flow diagram of an analog-to-digital signal conversion circuit with repeating deterministic signal summation formed in accordance with an embodiment of the present invention.

FIG. 1 shows an electrical flow diagram of the functional operations of an analog-to-digital (A/D) signal conversion circuit that includes repeating deterministic summation. First, an analog repeating deterministic signal 34 is added to an analog input voltage signal 28 in an analog signal summing step 24-1. The output of the analog signal summing step 24-1 is a repeating deterministic enhanced sensor signal 16, which is delivered to an A/D signal conversion step 22-1, thus producing a digital output voltage signal 32. Digital post-processor operations 35, such as oversampling and either averaging or adding, are applied to the digital output voltage signal 32 in the oversample & average block 35 (FIG. 2 processor 25) to take advantage of the added analog repeating deterministic signal 34. With the addition of the generated analog repeating deterministic signal 34 to the analog input voltage signal 28, and oversampling and averaging of the resultant digital output signal 32, the resolution of the analog to digital conversion step 22-1 can be increased.

Figure 2:
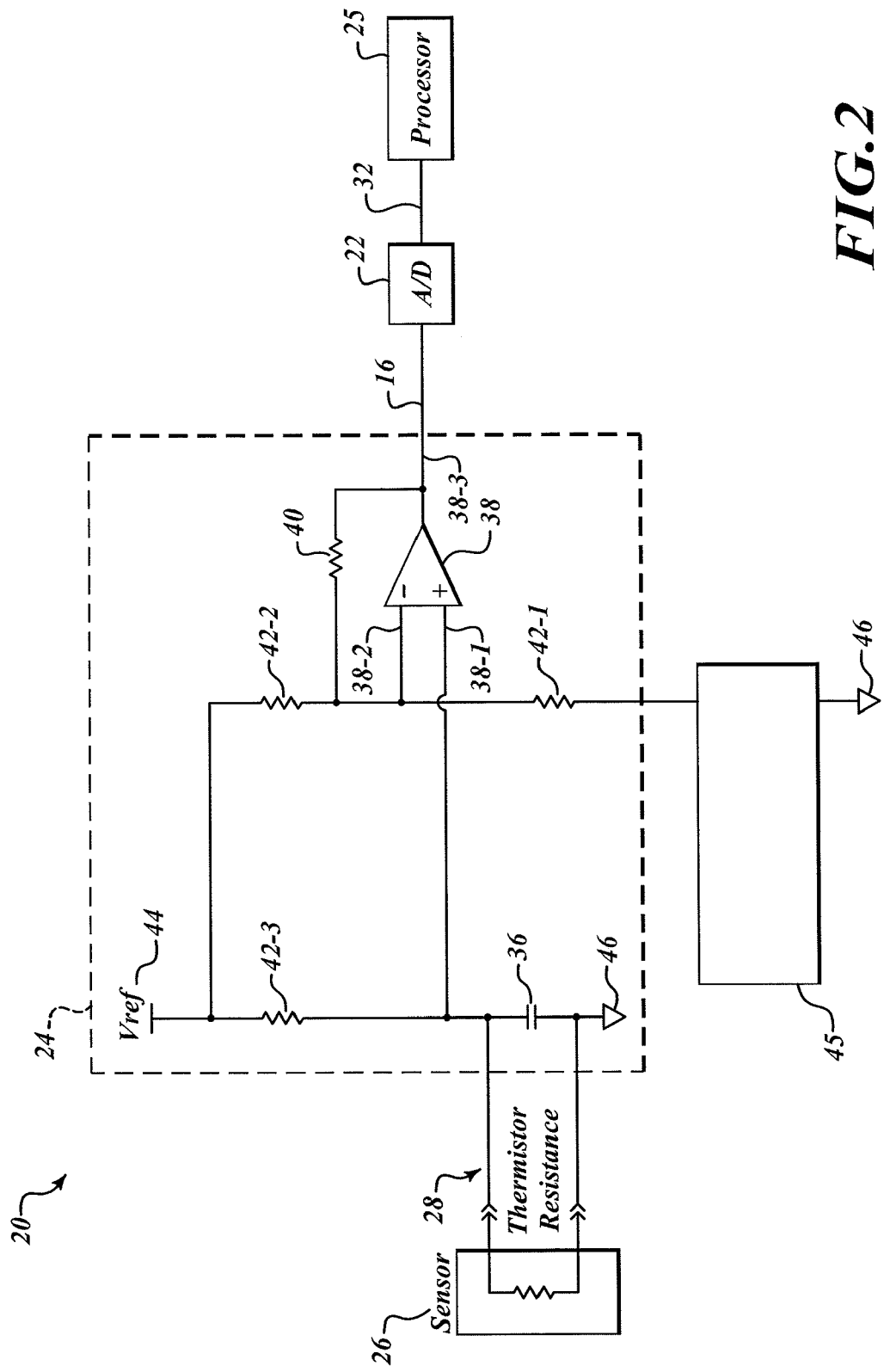
FIG. 2 is a circuit diagram of a circuit for providing repeating deterministic signal summation to an analog-to-digital converter.

FIG. 2 shows an A/D conversion circuit 20. In this embodiment, the circuit 20 is a temperature monitoring circuit that includes an A/D converter 22, an analog signal conditioning circuit 24, a processor 25, a sensor 26 and a repeating deterministic signal generating circuit 45. The sensor 26 is connected to the A/D converter 22 by the analog signal conditioning circuit 24. The sensor 26 outputs an analog input voltage signal 28 that is delivered to the signal conditioning circuit 24. The signal conditioning circuit 24 outputs the pseudo-noise enhanced sensor signal 16 that is delivered to the A/D converter 22. The A/D converter 22 outputs the digital output voltage signal 32 that is delivered to the processor 25. The repeating deterministic signal generating circuit 45 provides an analog repeating deterministic signal 34 to the analog signal conditioning circuit 24.

In one embodiment, the signal conditioning circuit 24 includes a capacitive filter 36, an operational amplifier 38, a feedback resistor 40, a plurality of circuit resistors 42-1 42-2 42-3, a reference voltage source 44, and a ground connection 46. The operational amplifier 38 includes a positive input port 38-1, a negative input port 38-2 and an output port 38-3.

In this embodiment, the electrical components of the analog signal conditioning circuit 24 are connected as is ordinary to one skilled in the art of analog signal conditioning. This includes constructing a differential operational amplifier filter and amplification circuit, including the following electrical component connections: the capacitive filter 36 is connected across the input of the analog signal conditioning circuit 24, one leg to the output of the sensor 26 and the other to the ground connection 46. The operational amplifier output port 38-3 is connected to the input of the A/D converter 22. The feedback resistor 40 is connected across the operational amplifier negative input port 38-2 and the operational amplifier output port 38-3. The operational amplifier negative input port 38-2 is separated from the ground connection 46 by circuit resistor 42-1 and is separated from the reference voltage source 44 by circuit resistor 42-2. The operational amplifier positive input port 38-1 is connected to the output of the sensor 26 and is separated from the reference voltage source 44 by circuit resistor 42-3.

The analog signal conditioning circuit 24 is a differential operational amplifier signal conditioning circuit which filters and amplifies the analog input voltage signal 28 received from the sensor 26 before it is delivered to input of the A/D converter 22. Understandably the analog signal conditioning circuit 24 can take on a number of circuit configurations that accomplish the same filtering and amplification function without deviating from the thrust of this invention.

Figure 3:
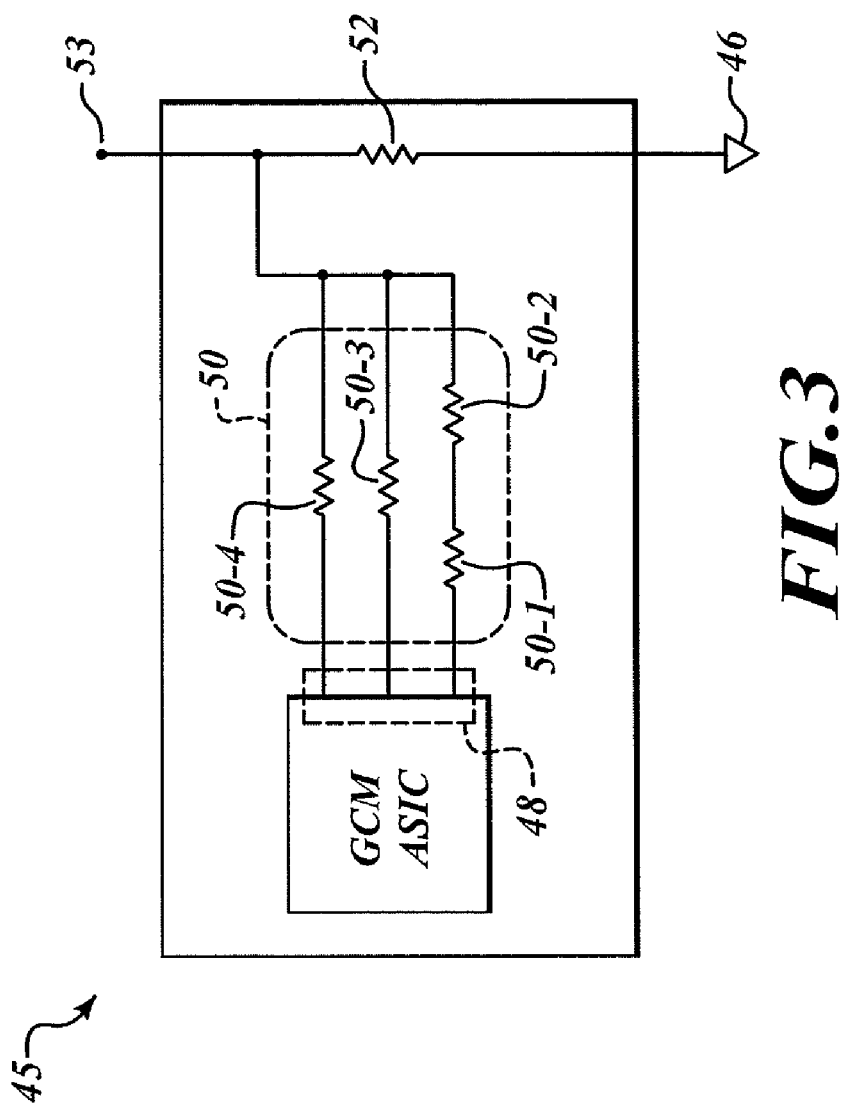
FIG. 3 is a circuit diagram of a repeating deterministic signal generating circuit formed in accordance with an embodiment of the present invention.

FIG. 3 shows a simple repeating deterministic generating circuit 45. The repeating deterministic generating circuit 45 is a signal source for the analog repeating deterministic signal 34 that is added to the analog input voltage signal 28 in the signal conditioning circuit 24 of FIG. 2. The repeating deterministic signal generating circuit 45 includes a plurality of switchable voltage source outputs 48, a resistor network 50, and a current summing resistor 52. The resistor network 50 includes a first resistor 50-1, a second resistor 50-2, a third resistor 50-3, and a fourth resistor 50-4. In one embodiment, the plurality of switchable voltage source outputs 48 is an application specific integrated circuit (ASIC) with multiple output pins.

The plurality of individual resistors 50-1, 50-2, 50-3, 50-4 is connected in a combination of series and parallel connections to furnish a plurality of branches. One end of each parallel branch is connected to one of a plurality of the switchable voltage source outputs 48. At the other end of each parallel branch, the plurality of branches is connected together at a common repeating deterministic signal output node 53. The repeating deterministic signal output node 53 is connected to the ground connection 46 through the current summing resistor 52. In one embodiment, the switchable voltage source outputs 48 are connected to a common voltage source and the switchable voltage source outputs 48 are switches. In another embodiment the ASIC with multiple output pins provides a fixed voltage at each pin. Digital control of the ASIC allows each output pin to be switched on and off independently. This allows for multiple combinations of output pins having a voltage at their output.

In one embodiment, the first, second and third resistors 50-1, 50-2 and 50-3 of the resistor network 50 share a common resistance value, and the fourth resistor 50-4 has a value one half that of the first, second and third resistors 50-1, 50-2, 50-3. Furthermore, the first and second resistors 50-1 and 50-2 are connected in series. The resistor network 50 includes three branches. The first branch includes the series connection of the first and second resistors 50-1, 50-2. The second branch includes the third resistor 50-3. The third branch includes the fourth resistor 50-4. One end of each of the three branches of the resistor network 50 is connected to a different one of the three switchable source outputs 48.

The output measured at the repeating deterministic signal output node 53, the connection of the branches of the resistor network 50 to the current summing resistor 52, is defined as the analog repeating deterministic signal 34. The achievable values for the analog repeating deterministic signal 34 by the repeating deterministic signal generating circuit 45 depends on the value of the voltage available at the switchable voltage source outputs 48, the individual resistor values selected for the plurality of resistors 50-1, 50-2, 50-3, 50-4 that make up the resistor network 50, the configuration of the plurality of resistors 50-1, 50-2, 50-3, 50-4 that make up the resistor network 50, and the value of the current summing resistor 52.

Once individual resistor values and a configuration for connecting them is selected, and the value of the voltage available at the switchable voltage source outputs 48 is selected, the output of the analog repeating deterministic signal 34 is regulated by which ones of the switchable voltage source outputs 48 are switched on. FIG. 4 shows the combinations of the switchable voltage source outputs 48 available for an embodiment having three outputs. Each combination is represented by one of the digital voltage levels [000], [001], [010], [011], [100], [101], [110] and [111]. For the embodiment using an ASIC, these are the available combinations for an ASIC having three output pins.

Figure 5:
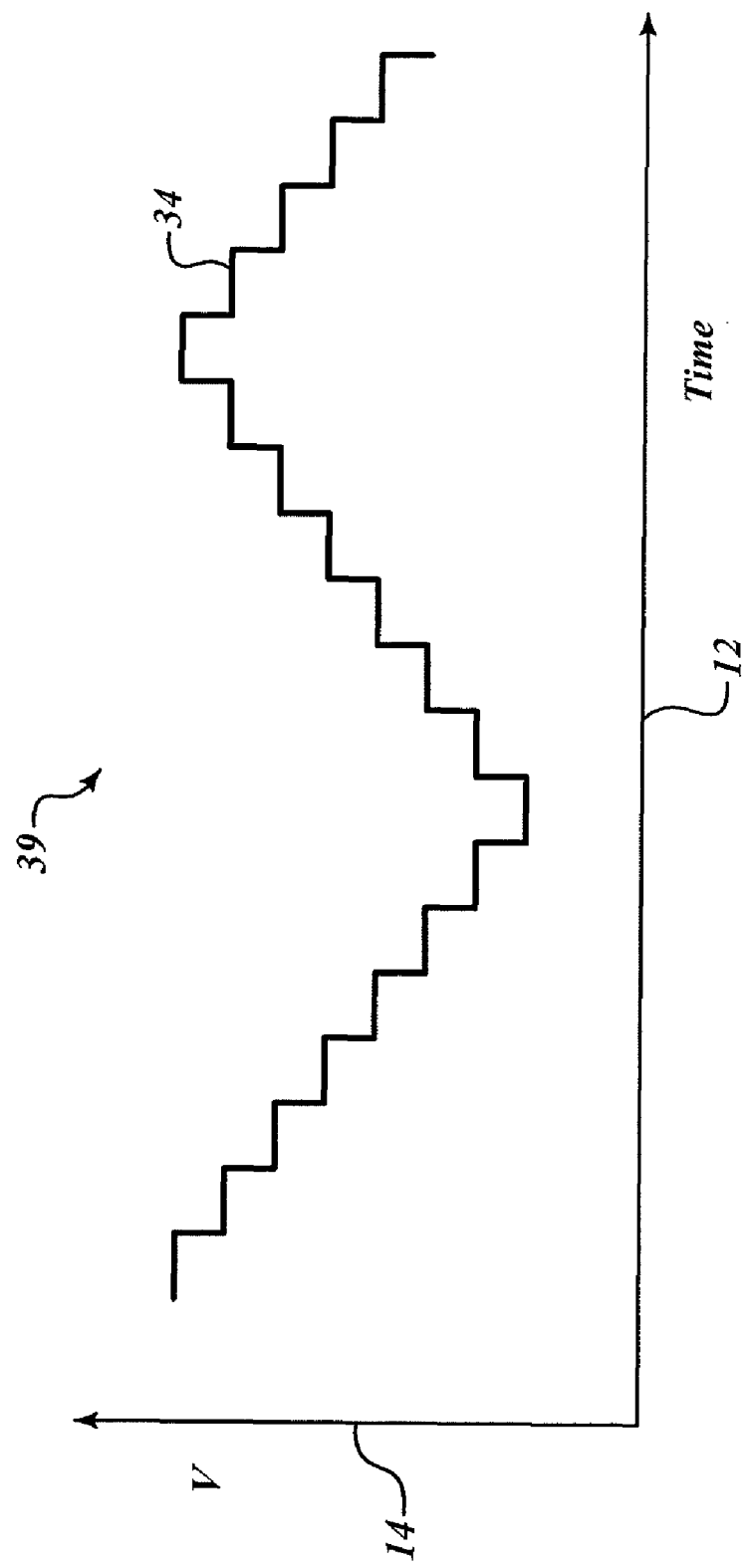

FIG. 5 shows an embodiment of the analog repeating deterministic signal 34 generated by the repeating deterministic signal generating circuit 45. In a plot of repeating deterministic signal 34, time is plotted on an independent axis 12 and voltage on a response axis 14. The analog repeating deterministic signal 34 is an exemplary repeating deterministic signal generated by the repeating deterministic signal generating circuit 45 shown in FIG. 3. By sequentially switching through each of eight possible combinations of the three switchable voltage source outputs 48 represented by digital voltage levels [000], [001], [010], [011], [100], [101], [110]

and [111], eight different voltage levels can be achieved in the analog repeating deterministic signal 34.

In one embodiment, to maximize the reduction in noise, the frequency at which the deterministic signal 34 changes voltage levels matches the length of one averaging period of the digital output voltage signal 32 divided by an integer multiple of the number of voltage levels in the deterministic signal 34. In applications emphasizing speed rather than accuracy, the integer multiple is raised and averaging is performed over only a portion of one period of the digital output voltage signal 32. Ordering them in ascending and then descending level of voltage output yields the signal in the embodiment of FIG. 5, however there are numerable alternative orders for the voltage levels of the deterministic signal 34 that can be added in to improve the resolution of the digital output voltage signal 32.

In alternative embodiments, a repeating deterministic signal, or a pseudo-noise signal of a different waveform is achievable by changing the order in which the switchable voltage source outputs 48 are activated. Frequency and periodicity of the waveform of the analog voltage signal 34 is also variable. The maximum number of unique voltage levels achievable is adjustable by adjusting the number of branches in the resistor network 50, adjusting the number of or value of the plurality of resistors 50-1, 50-2, 50-3, 50-4 that make up the resistor network 50, connecting the resistors of the resistor network 50 in a different configuration to yield branches of differing resistance value, or adjusting the switchable voltage source outputs 48 to offer a different voltage or voltages. Different number of samples can be averaged.

Figure 6:
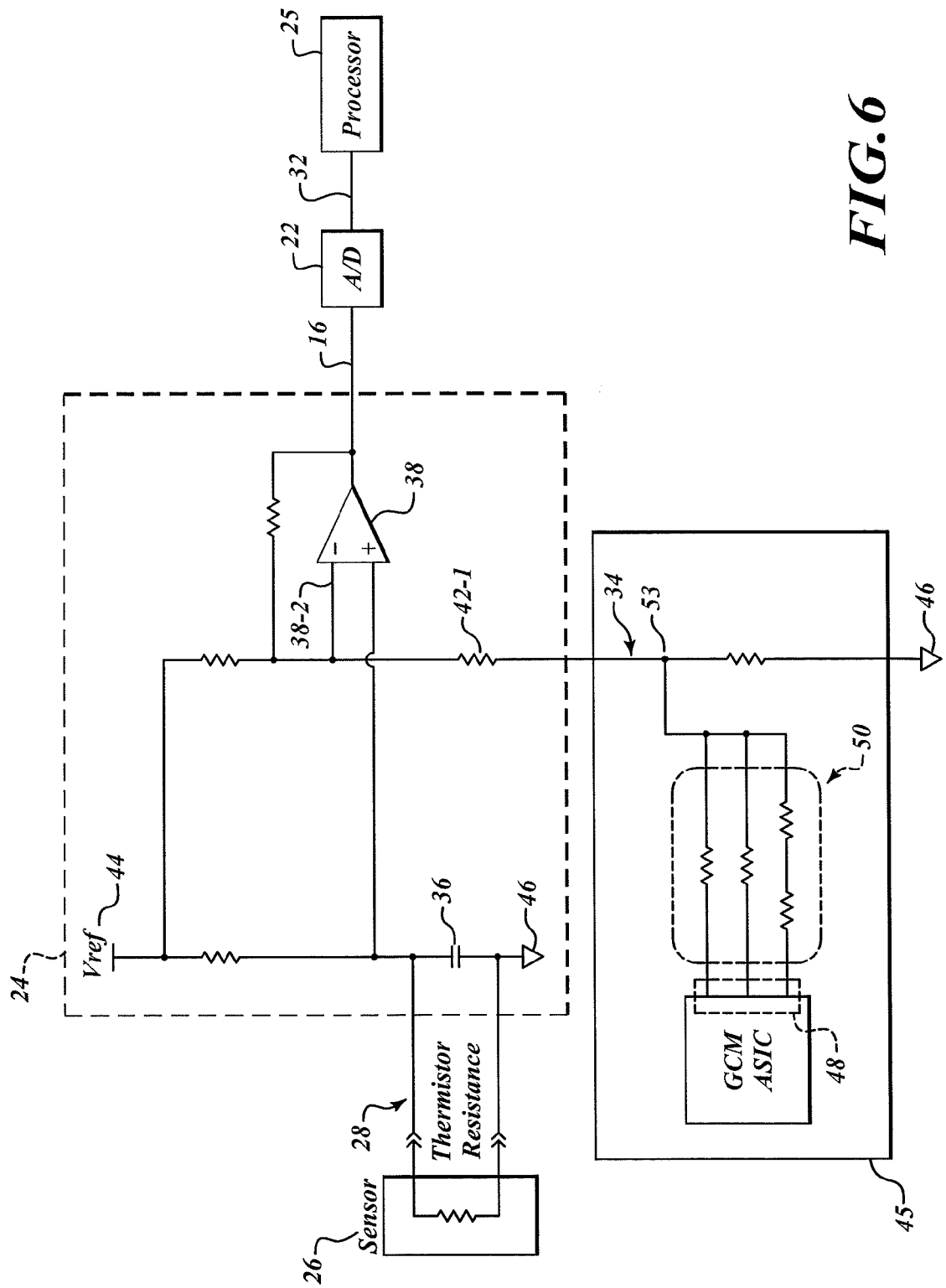

FIG. 6 shows the repeating deterministic signal generating circuit 45 connected to the analog signal conditioning circuit 24 by connection of the repeating deterministic signal output node 53 to the signal condition circuit 24 at the point at which the operational amplifier negative input port 38-2 in the signal conditioning circuit 24 was formerly connected to the ground connection 46. This changes the reference voltage of the operational amplifier 38, causing the analog repeating deterministic signal 34 to become added to the analog input voltage signal 28. After amplification by the operational amplifier 38, the sum of the input voltage 28 and the repeating deterministic signal 34 is delivered to the input of the A/D converter 22 as the analog A/D input voltage signal 16. With the addition of the analog repeating deterministic signal 34 to the analog input voltage signal 28, the analog A/D input voltage signal 16 contains sufficient pseudo-noise that following A/D conversion, there is sufficient distribution in the digital output voltage signal 32 for oversampling and averaging of the digital output voltage signal 32 to increase the effective resolution of A/D converter 22.

The benefit of the pseudo-noise signal generating circuit 45 is that the resolution of the A/D converter 22 can be increased cheaply and simply, and with little additional circuitry. In one embodiment, the switchable voltage source outputs 48 are integral to a field programmable gate array (FPGA) already available in the analog A/D signal conversion circuit 20 for other purposes. In this embodiment, the only additional required components are the plurality of resistors 50-1, 50-2, 50-3, 50-4 in the resistor network 50, and the connections between them, and the connection to the analog signal conditioning circuit 24. Therefore this solution has a benefit over other methods, such as adding white noise, general noise or a integrated digital-to-analog converter, in its simplicity, lower cost, and use of purely passive components. A further benefit of pseudo-noise over other noise sources is that because all frequency components of the pseudo-noise are above the highest frequency of the averaging periods of the digital output signal, the additional noise is not disruptive to the digital output voltage signal 32.

While the preferred embodiment of the invention has been illustrated and described, as noted above, many changes can be made without departing from the spirit and scope of the invention. For example, in alternative embodiments, different values or ratios for resistor values of the plurality of resistors 50-1, 50-2, 50-3, 50-4 could be used, different resistor branch configurations in the resistor network 50, a different number of switchable voltage source outputs 48, or connection of the repeating deterministic signal generating circuit 45 to an entirely different signal conditioning circuit 24. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. An apparatus comprising:
   a component configured to receive an input signal, generate a pseudo-noise signal, and add the pseudo-noise signal to the received signal, the component comprising a pseudo-noise signal generating device comprising:
   a common node configured to provide the pseudo-noise signal; and
   two or more pseudo-noise units coupled to the common node, the units configured to separately produce the pseudo-noise signal; and
   an analog-to-digital converter configured to digitize the added signals.

2. The apparatus of claim 1, wherein each pseudo-noise unit further comprises:
   one or more resistor groups; and
   a switchable voltage source, wherein each of the one or more resistor groups is connected at a first end to the common node and at a second end to the switchable voltage source.

3. The apparatus of claim 1, wherein the pseudo-noise signal generating device further comprises:
   three pseudo-noise units coupled to the common node, the units configured to separately produce the pseudo-noise signal, each unit producing a different voltage signal.

4. The apparatus of claim 3, wherein each pseudo-noise unit further comprises:
   one or more resistor groups; and
   a switchable voltage source, wherein each of the one or more resistor groups is connected at a first end to the common node and at a second end to the switchable voltage source.

5. The apparatus of claim 4, wherein one of the one or more resistor groups comprises two or more resistors connected in series.

6. The apparatus of claim 5, wherein two of the resistor groups comprise one resistor.

7. The apparatus of claim 4, wherein the switchable voltage sources of all the pseudo-noise units are included in an application specific integrated circuit (ASIC).

8. The apparatus of claim 1, further comprising a digital processor in signal communication with the analog-to-digital converter, the digital processor configured to oversample and average an output of the analog-to-digital converter.

9. The apparatus of claim 1, further comprising a digital processor in signal communication with the analog-to-digital converter, the digital processor configured to oversample and add an output of the analog-to-digital converter.

10. A method comprising:
    receiving an input signal;

generating a pseudo-noise signal by applying a voltage signal to a receiving node of at least one of a plurality of resistor groups, wherein output nodes of the resistor groups are co-located, thereby forming a common node;

receiving the pseudo-noise signal;

summing the input signal and the pseudo-noise signal; and converting the summed input signal and pseudo-noise signal to a digital signal.

11. The method of claim 10, further comprising altering the pseudo-noise signal at the common node by changing the application of the voltage signal to at least one of the receiving nodes.

12. The method of claim 10, wherein generating comprises one of increasing or decreasing the voltage of the pseudo-noise signal.

13. The method of claim 11, further comprising oversampling and averaging the digital signal.

14. The method of claim 11, further comprising oversampling and adding the digital signal.

15. The method of claim 11, wherein at least one of the resistor groups comprises two or more resistors in series.

16. A system comprising:

a means for receiving an input signal;

a means for receiving a pseudo-noise signal;

a means for summing the input signal and the pseudo-noise signal; and a means for generating the pseudo-noise signal by applying a voltage signal to a receiving node of at least one of a plurality of resistor groups, wherein output nodes of the resistor groups are co-located, thereby forming a common node.

17. The system of claim 16, further comprising a means for altering the pseudo-noise signal at the common node by changing the application of the voltage signal to at least one of the receiving nodes.

* * * * *